US009209854B2

(12) United States Patent
Kim et al.

(10) Patent No.: US 9,209,854 B2
(45) Date of Patent: Dec. 8, 2015

(54) RADIO FREQUENCY SWITCHING CIRCUIT WITH ADVANCED ISOLATION CHARACTERISTICS

(71) Applicant: SAMSUNG ELECTRO-MECHANICS CO., LTD., Suwon-Si, Gyeonggi-Do (KR)

(72) Inventors: Yoo Hwan Kim, Suwon-Si (KR); Yoo Sam Na, Suwon-Si (KR); Hyun Jin Yoo, Suwon-Si (KR); Jong Myeong Kim, Suwon-Si (KR); Hyun Hwan Yoo, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 64 days.

(21) Appl. No.: 14/281,324

(22) Filed: May 19, 2014

(65) Prior Publication Data

US 2015/0118976 A1    Apr. 30, 2015

(30) Foreign Application Priority Data

Oct. 28, 2013    (KR) .................. 10-2013-0128227

(51) Int. Cl.
*H04B 1/44*    (2006.01)
*H04W 52/02*   (2009.01)

(52) U.S. Cl.
CPC ............. *H04B 1/44* (2013.01); *H04W 52/0209* (2013.01)

(58) Field of Classification Search
CPC ........... H04B 1/48; H04B 1/44; H04B 1/525; H04B 1/406; H04B 1/18; H04B 1/40; H04B 1/54
USPC ............. 455/77, 78, 107, 120, 121, 313, 334, 455/550.1
See application file for complete search history.

(56) References Cited

U.S. PATENT DOCUMENTS

| | | | | |
|---|---|---|---|---|
| 6,804,502 B2 * | 10/2004 | Burgener | ................. | H01P 1/15 257/341 |
| 7,460,852 B2 | 12/2008 | Burgener et al. | | |
| 7,468,638 B1 * | 12/2008 | Tsai | ........................ | H04B 1/48 331/126 |
| 7,796,969 B2 | 9/2010 | Kelly et al. | | |
| 8,811,920 B2 * | 8/2014 | Deuchars | .............. | H03F 1/0227 257/299 |
| 2011/0273248 A1 * | 11/2011 | Nicolson | .................. | H03H 7/25 333/81 A |
| 2012/0056681 A1 * | 3/2012 | Lee | ....................... | H03F 1/0277 330/310 |

FOREIGN PATENT DOCUMENTS

JP    06-311007 A    11/1994
JP    2007-259112 A    10/2007

* cited by examiner

*Primary Examiner* — Nhan Le
(74) *Attorney, Agent, or Firm* — NSIP Law

(57) ABSTRACT

A radio frequency switching circuit may include a first switching circuit unit including first to $n^{th}$ (n is a natural number greater than at least 2) transistors M1 to Mn connected in series between a first signal port for transmission and reception of signals and a common connection node connected to an antenna port and operated according to a first gate signal; a second switching circuit unit connected in series between the common connection node and a second signal port for transmission and reception of signals and operated according to a second gate signal; and a first impedance adjuster forming an alternating current (AC) ground path between a ground and a gate of the first transistor of the first switching circuit unit when the first switching circuit unit is in an off-state.

18 Claims, 6 Drawing Sheets

RADIO FREQUENCY SWITCHING CIRCUIT WITH ADVANCED ISOLATION CHARACTERISTICS

CROSS-REFERENCE TO RELATED APPLICATION

This application claims the benefit of Korean Patent Application No. 10-2013-0128227 filed on Oct. 28, 2013, with the Korean Intellectual Property Office, the disclosure of which is incorporated herein by reference.

BACKGROUND

The present disclosure relates to a radio frequency switching circuit with advanced isolation characteristics, for application to a communications system.

In general, a semiconductor integrated circuit installed in a communications system includes a radio frequency switching circuit for controlling a transfer path of a radio frequency signal between an antenna and transmitter/receiver. Radio frequency switching circuits are commonly used in communications systems such as Bluetooth™, cellular personal communications services (PCS)/code division multiple access (CDMA)/wideband code division multiple access (WCDMA)/time division multiple access (TDMA)/global system (GSM)/standard for mobile communications, and other communications schemes, as well as in wireless local area networks (LAN).

In general, a radio frequency switching circuit is used between a transmitter and a receiver in various communications systems using time-division multiplexing (TDM). By virtue of this radio frequency switching circuit, the transmitter and the receiver are alternately turned on and off, thereby reducing overall power consumption of a system and also reducing interference between the transmitter and the receiver.

For the radio frequency switching circuits, low insertion loss, high degrees of isolation, high switching speeds, and high power handling capabilities are required, and low harmonic distortion, that is, a high degree of linearity, is required even if a large signal is input.

Among these characteristics, as insertion loss characteristics are enhanced, degradations in the sensitivity of a receiver and a transmitter power loss during transmissions, due to a switch may be reduced. Power handling capability ensures the maximum output of power from the transmitter. In addition, high isolation characteristics minimize influence upon the receiver that is turned off when the transmitter operates, and vice versa.

In particular, in a mobile communications system, among the aforementioned characteristics, insertion loss and power handling capabilities are more required.

In a conventional wireless communications apparatus, a radio frequency switching circuit includes a plurality of radio frequency ports connected to a plurality of transmitters/receives, respectively, and a common port connected to antennas.

The radio frequency switching circuit controls a transfer path of a radio frequency signal between the plurality of radio frequency ports and the common port to select one of the plurality transmitters/receivers connected to the radio frequency switching circuit to be electrically connected to an antenna.

A conventional radio frequency switching circuit may include a switching circuit portion connected between each radio frequency port and a common port and a shunt circuit portion connected between each radio frequency port and a ground in order to convert a transfer path of a radio frequency signal between each radio frequency port and the common port.

In this case, the switching circuit portion may include a transmission switching circuit portion Tx SW and a reception switching circuit portion Rx SW, and each of the transmission switching circuit portion and the reception switching circuit portion may include a plurality of semiconductor switches.

The semiconductor switch may be a switching device formed on a silicon on insulator (SOI) substrate and may include a metal oxide silicon field effect transistor (MOSFET).

In a conventional radio frequency switching circuit, in order to prepare a case in which a signal having a voltage higher than a breakdown voltage of one transistor is applied, the switching circuit portion includes a structure obtained by stacking a plurality of transistors.

In the structure obtained by stacking a plurality of transistors, a voltage higher than a rated voltage is divided and applied to a plurality of transistors, and thus, a voltage applied to one transistor is reduced to protect transistors from a high voltage.

In the conventional radio frequency switching circuit, a gate signal Vg having a voltage higher or lower than a threshold voltage Vth of each transistor included in the transmission switching circuit portion and the reception switching circuit portion is applied to a gate of each transistor so as to control the transistor to be in an on-state or an off-state. The gate signal Vg may be provided by a base band chip set.

However, in order to ensure isolation required between the transmitter and the receiver, the conventional radio frequency switching circuit includes a shunt circuit portion for bypassing unnecessary signals to a ground in addition to the switching circuit portion for selection of a signal path.

In addition, the conventional shut circuit portion includes a plurality of transistors stacked in series, and thus, problems arise in that a product size is increased.

Patent Document 1 of Related Art Document below discloses a radio frequency switch and a semiconductor apparatus but does not disclose technical features for improving isolation while replacing a shunt circuit portion acting as a burden due to a large size thereof.

RELATED ART DOCUMENT (Patent Document 1) Japanese Patent Laid-Open Publication No. 2007-259112

SUMMARY

An aspect of the present disclosure may provide a radio frequency switching circuit for improving isolation characteristics while replacing a shunt circuit unit acting as a burden due to a large size thereof.

According to a first aspect of the present disclosure, a radio frequency switching circuit may include a first switching circuit unit including first to $n^{th}$ (n is a natural number greater than at least 2) transistors M1 to Mn connected in series between a first signal port for transmission and reception of signals and a common connection node connected to an antenna port and operated according to a first gate signal; a second switching circuit unit connected in series between the common connection node and a second signal port for transmission and reception of signals and operated according to a second gate signal; and a first impedance adjuster forming an alternating current (AC) ground path between a ground and a gate of the first transistor of the first switching circuit unit when the first switching circuit unit is in an off-state.

According to a second aspect of the present disclosure, a radio frequency switching circuit may include a reception switching circuit unit including first to $n^{th}$ (n is a natural number greater than at least 2) transistors connected in series between a first signal port for transmission and reception of signals and a common connection node connected to an antenna port and operated according to a first gate signal; a transmission switching circuit unit including first to $m^{th}$ (m is a natural number greater than at least 2) transistors connected in series between a second signal port for transmission and reception of signals and the common connection node and operated according to a second gate signal; a first impedance adjuster forming an alternating current (AC) ground path between a ground and a gate of the first transistor of the reception switching circuit unit when the reception switching circuit unit is in an off-state; and a second impedance adjuster forming an AC ground path between a ground and a gate of the first transistor of the transmission switching circuit unit when the transmission switching circuit unit is in an off-state.

The first impedance adjuster may include a first switching device and a first capacitor connected in series between the ground and the gate of the first transistor of the reception switching circuit unit, and the first switching device may perform a complementary switching operation in conjunction with the reception switching circuit unit and alternately grounds the gate of the first transistor of the reception switching circuit unit through the first capacitor.

According to the first and second aspects of the present disclosure, the first switching device of the first impedance adjuster may be in an on-state to bypass a signal supplied to the gate of the first transistor of the reception switching circuit unit to the ground through the first capacitor of the first impedance adjuster when the reception switching circuit unit is in an off-state.

The first capacitor of the first impedance adjuster may have higher capacitance than parasitic capacitance between the gate and a source of the first transistor of the reception switching circuit unit.

According to the second aspect of the present disclosure, the second impedance adjuster may include a second switching device and a second capacitor connected in series between the ground and the gate of the first transistor of the transmission switching circuit unit, and the second switching device may perform a complementary switching operation in conjunction with the transmission switching circuit unit and alternately ground the gate of the first transistor of the transmission switching circuit unit through the second capacitor.

The second switching device of the second impedance adjuster may be in an on-state to bypass a signal supplied to the gate of the first transistor of the transmission switching circuit unit to the ground through the second capacitor of the second impedance adjuster when the transmission switching circuit unit is in an off-state.

The second capacitor of the second impedance adjuster may have higher capacitance than parasitic capacitance between the gate and a source of the first transistor of the transmission switching circuit unit.

According to a third aspect of the present disclosure, a radio frequency switching circuit may include a reception switching circuit unit including first to $n^{th}$ (n is a natural number greater than at least 2) transistors connected in series between a first signal port for transmission and reception of signals and a common connection node connected to an antenna port and operated according to a first gate signal, a transmission switching circuit unit including first to $m^{th}$ (m is a natural number greater than at least 2) transistors connected in series between a second signal port for transmission and reception of signals and the common connection node and operated according to a second gate signal; a first impedance adjuster forming an alternating current (AC) ground path between a ground and a gate of each of at least two transistors including the first transistor among the first to $n^{th}$ transistors of the reception switching circuit unit when the reception switching circuit unit is in an off-state, and a second impedance adjuster forming an AC ground path between a ground and a gate of each of at least two transistors including the first transistor among the first to $m^{th}$ transistors of the transmission switching circuit unit when the transmission switching circuit unit is in an off-state.

The first impedance adjuster may include first to $n^{th}$ impedance circuit units connected between grounds and gates of the respective first to $n^{th}$ transistors of the reception switching circuit unit, each of the first to $n^{th}$ impedance circuit units may include a first switching device and a first capacitor connected in series between the ground and the gate of each of the first to $n^{th}$ transistors of the reception switching circuit unit, and the first switching device may perform a complementary switching operation in conjunction with the reception switching circuit unit and alternately ground the gate of a corresponding transistor of the reception switching circuit unit through the first capacitor.

The first switching device of the first impedance adjuster may be in an on-state to bypass a signal supplied to the gate of the corresponding transistor among the first to $n^{th}$ transistors of the reception switching circuit unit through the first capacitor of the first impedance adjuster when the reception switching circuit unit is in an off-state.

The first capacitor of the first impedance adjuster may have higher capacitance than parasitic capacitance between the gate and a source of the corresponding transistor of the first to $n^{th}$ transistors of the reception switching circuit unit.

The second impedance adjuster may include first to $m^{th}$ impedance circuit units connected between grounds and gates of the respective first to $m^{th}$ transistors of the transmission switching circuit unit, each of the first to $m^{th}$ impedance circuit units may include a second switching device and a second capacitor connected in series between the ground and the gate of each of the first to $m^{th}$ transistors of the transmission switching circuit unit, and the second switching device may perform a complementary switching operation in conjunction with the transmission switching circuit unit and alternately ground the gate of a corresponding transistor of the transmission switching circuit unit through the second capacitor.

The second switching device of the second impedance adjuster may be in an on-state to bypass a signal supplied to the gate of the corresponding transistor among the first to $m^{th}$ transistors of the transmission switching circuit unit to the ground through the second capacitor of the second impedance adjuster when the transmission switching circuit unit is an off-state.

The second capacitor of the second impedance adjuster may have higher capacitance than parasitic capacitance between the gate and a source of the corresponding transistor of the first to $m^{th}$ transistors of the transmission switching circuit unit.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
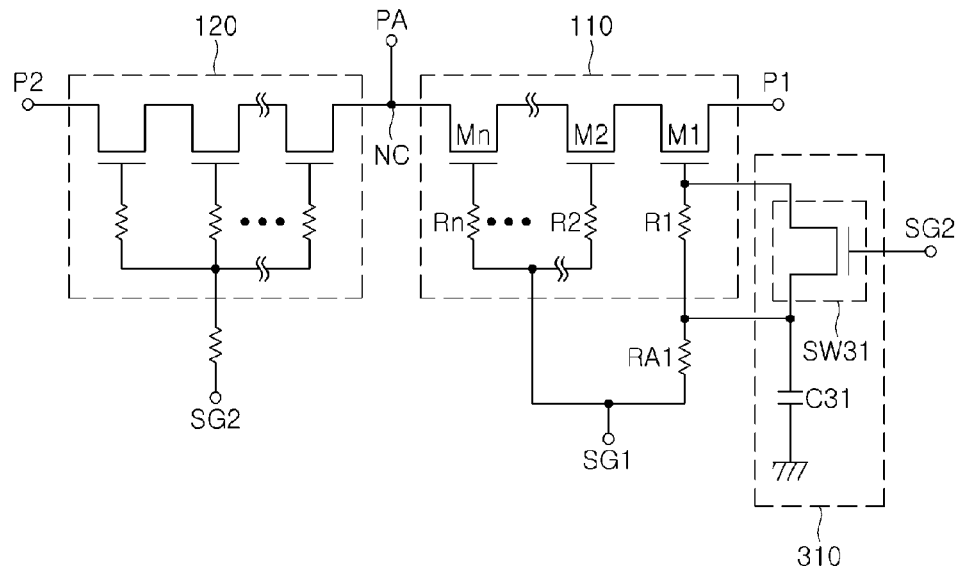
FIG. 1 is a diagram illustrating an example of a radio frequency switching circuit according to a first embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Throughout the drawings, the same or like reference numerals will be used to designate the same or like elements.

Figure 2:
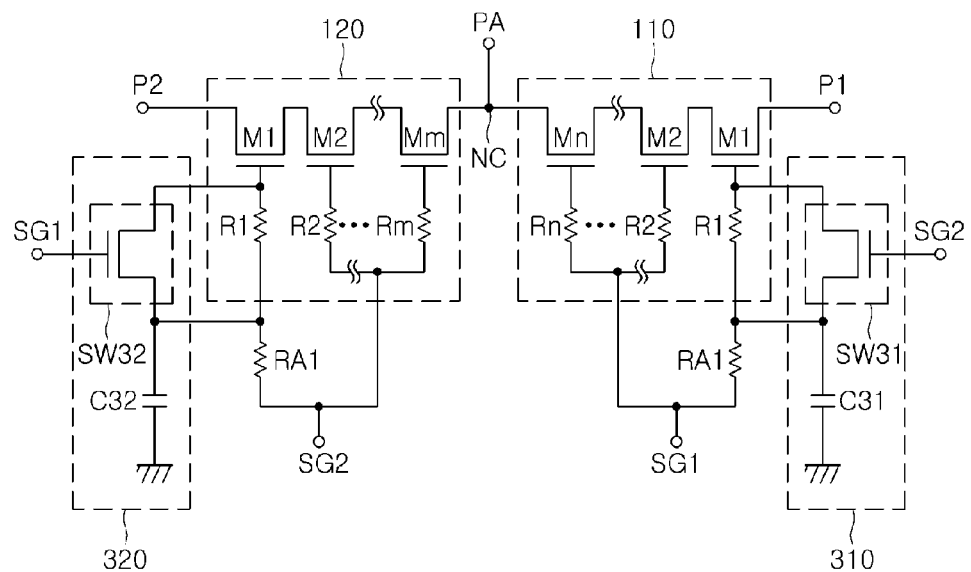
FIG. 2 is a diagram illustrating an example of a radio frequency switching circuit according to a second embodiment of the present disclosure.

FIG. 1 is a diagram illustrating an example of a radio frequency switching circuit according to a first embodiment of the present disclosure. FIG. 2 is a diagram illustrating an example of a radio frequency switching circuit according to a second embodiment of the present disclosure.

Referring to FIGS. 1 and 2, a radio frequency switching circuit according to the first and second embodiments of the present disclosure may include a first switching circuit unit 110 and a second switching circuit unit 120.

The first switching circuit unit 110 may include first to $n^{th}$ (n is a natural number greater than at least 2) transistors M1 to Mn that are connected in series between a first signal port P1 for transmission and reception of signals and a common connection node NC connected to an antenna port PA, and may be operated according to a first gate signal SG1. In this case, the first switching circuit unit 110 may be a reception switching circuit unit or a transmission switching circuit unit.

For example, when the first switching circuit unit 110 is a reception switching circuit unit, if the first gate signal SG1 is in a high level in a reception mode, a reception signal input through the antenna port PA may be supplied to a receiver (not shown). In addition, the first switching circuit unit 110 may be switched off when the first gate signal SG1 is a low level in a transmission mode.

The second switching circuit unit 120 may be connected in series between the common connection node NC and a second signal port P2 for transmission and reception of signals and may be operated according to a second gate signal SG2. In this case, the second switching circuit unit 120 may be a transmission switching circuit unit or a reception switching circuit unit. Here, the first and second gate signals SG1 and SG2 may be logic signals having opposite phases and may be supplied from a baseband circuit unit, or a separate signal processor, a controller, or the like.

For example, when the second switching circuit unit 120 is a transmission switching circuit unit, when the second gate signal SG2 is in a high level in a transmission mode, the second switching circuit unit 120 may be switched on and supply a transmission signal from a transmitter (not shown) to the antenna port PA. In addition, when the second gate signal SG2 is in a low level in a reception mode, the second switching circuit unit 120 may be switched off.

Referring to FIGS. 1 and 2, the radio frequency switching circuit according to the first and second embodiments of the present disclosure may further include a first impedance adjuster 310.

When the first switching circuit unit 110 is in an off-state, the first impedance adjuster 310 may form an alternating current (AC) ground path between a ground and a gate of the first transistor M1 of the first switching circuit unit 110.

In this case, a signal that is supplied to the gate of the first transistor M1 in an off-state through parasitic capacitance of the first transistor M1 may be by-passed to the ground.

According to an embodiment of the present disclosure, the first impedance adjuster 310 may include a first switching device SW31 and a first capacitor C31 that are connected in series between the ground and the gate of the first transistor M1 of the first switching circuit unit 110.

In this case, the first switching device SW31 may perform switching complementarily to the first switching circuit unit 110 and may alternately ground the gate of the first transistor M1 of the first switching circuit unit 110 through the first capacitor C31.

Referring to FIG. 2, in the radio frequency switching circuit according to the second embodiment of the present disclosure, the second switching circuit unit 120 may include second to $m^{th}$ (m is a natural number greater than at least 2) transistors M1 to Mm that are connected in series between the second signal port P2 for transmission and reception of signals and the common connection node NC connected to the antenna port PA, and may be operated according to the second gate signal SG2. In this case, the second switching circuit unit 120 may be a reception switching circuit unit or a transmission switching circuit unit.

Here, n and m are each a natural number equal to or greater than 2, may refer to the number of stacked transistors, and may be the same or not.

In this case, the radio frequency switching circuit according to the second embodiment of the present disclosure may further include a second impedance adjuster 320.

When the second switching circuit unit 120 is in an off-state, the second impedance adjuster 320 may form an AC ground path between the ground and the gate of the first transistor M1 of the second switching circuit unit 120.

In this case, a signal that is supplied to the gate of the first transistor M1 in an off-state through parasitic capacitance of the first transistor M1 may be by-passed to the ground.

According to an embodiment of the present disclosure, the second impedance adjuster 320 may include a second switching device SW32 and a second capacitor C32 that are connected in series between the ground and the gate of the first transistor M1 of the second switching circuit unit 120.

In this case, the second switching device SW32 may perform switching complementarily to the second switching circuit unit 120 and may alternately ground the gate of the first transistor M1 of the second switching circuit unit 120 through the second capacitor C32.

For example, the first switching device SW31 may include a switch transistor having a drain connected to the gate of the first transistor M1 of the first switching circuit unit 110, a gate connected to the second gate signal SG2, and a source connected to a ground through the first capacitor C31 and simultaneously receiving the first gate signal SG1 through a resistor RA1, and the switch transistor may be a MOSFET. The source of the MOSFET may receive the first gate signal SG1 through the resistor RA1.

The second switching device SW32 may include a switch transistor having a drain connected to the gate of the first transistor M1 of the second switching circuit unit 120, a gate connected to the first gate signal SG1, and a source connected to a ground through the second capacitor C32 and simultaneously receiving the second gate signal SG2 through the resistor RA1, and the switch transistor may be a MOSFET. The source of the MOSFET may receive the second gate signal SG2 through the resistor RA1.

The aforementioned first and second switching devices SW31 and SW32 may have the same connection structure in each embodiment of the present disclosure, and a repeated description thereof will be omitted.

Figure 3:
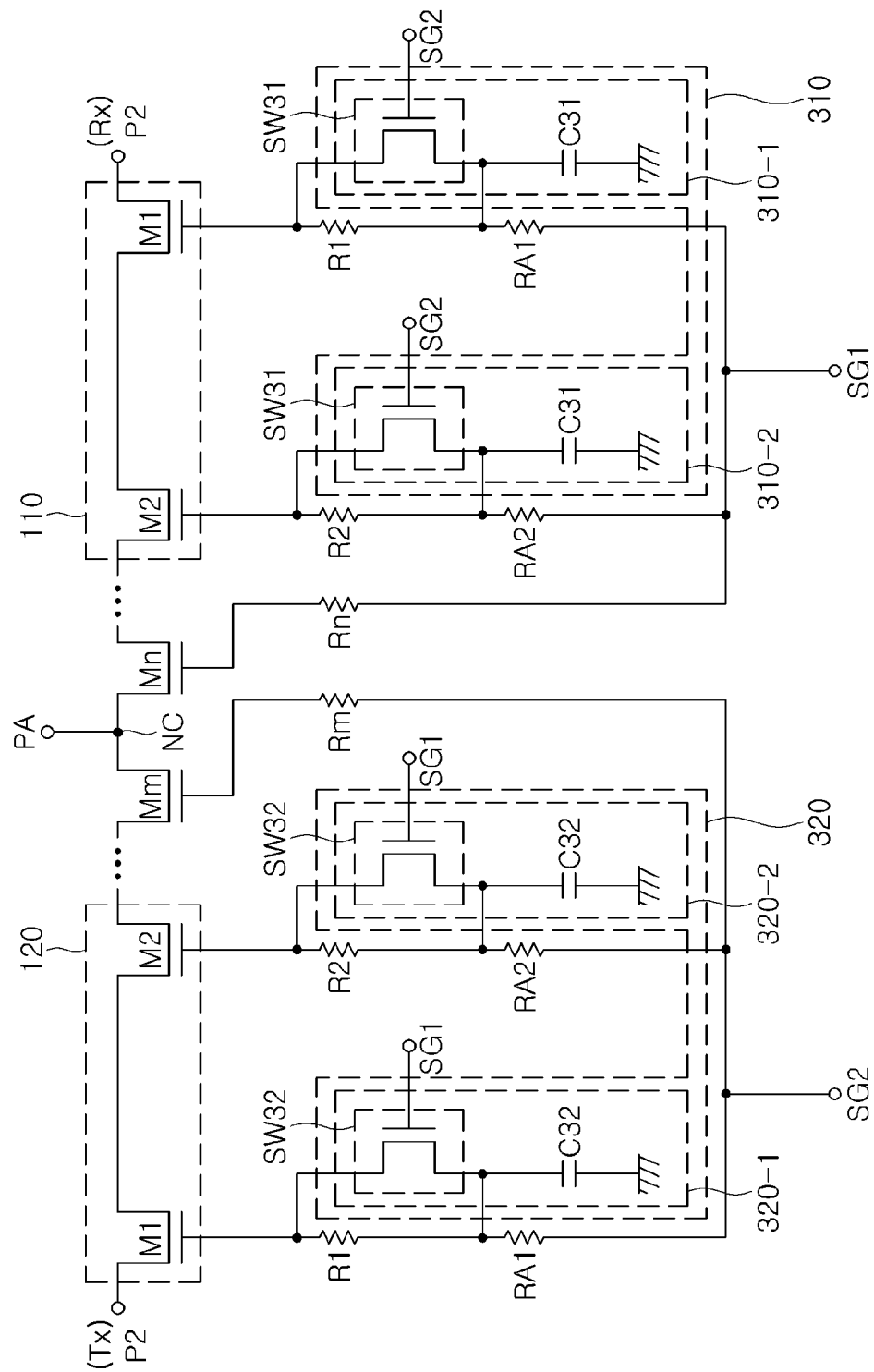
FIG. 3 is a diagram illustrating an example of a radio frequency switching circuit according to a third embodiment of the present disclosure.
Figure 4:
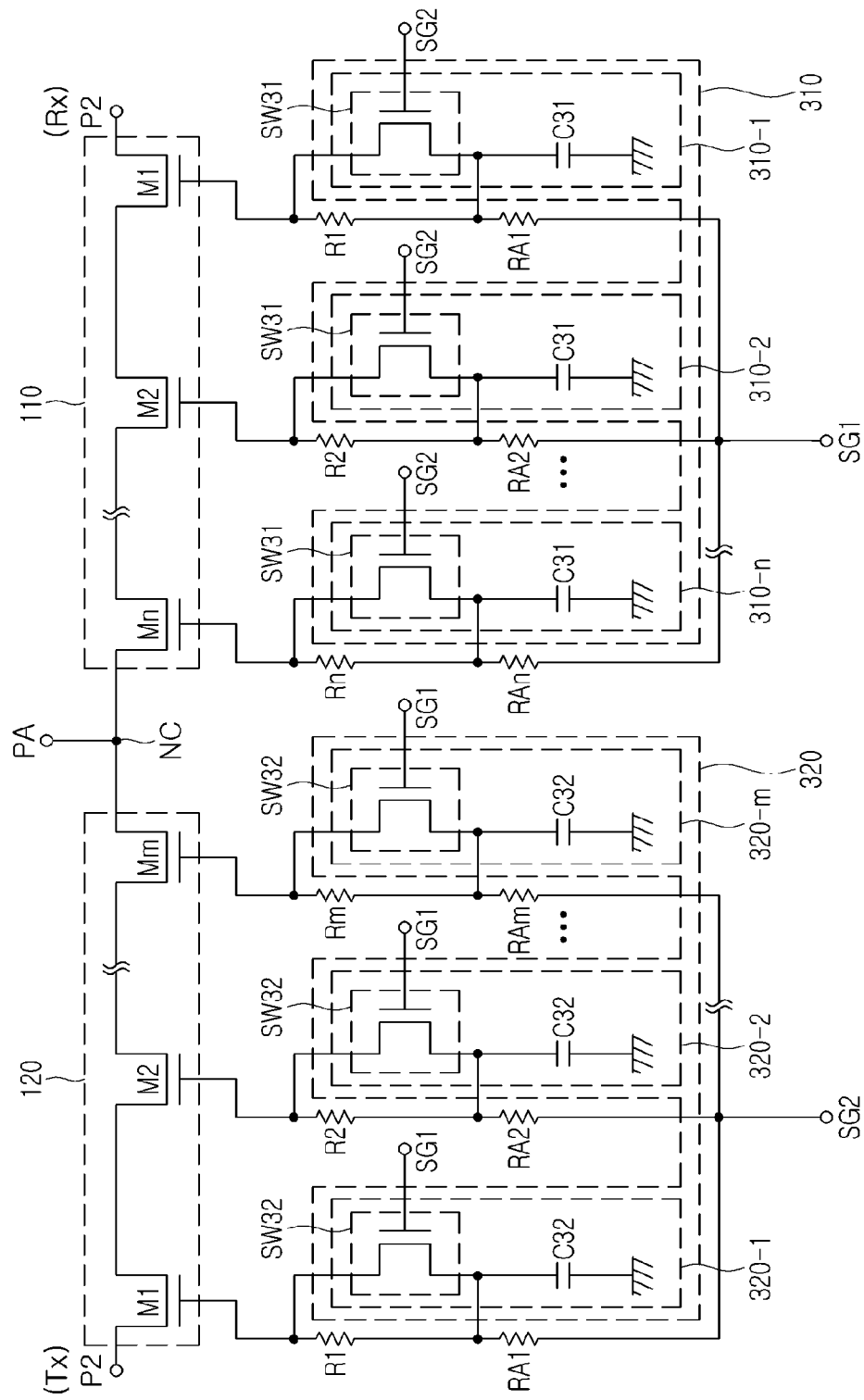
FIG. 4 is a diagram illustrating an example of a radio frequency switching circuit according to a fourth embodiment of the present disclosure.

FIG. 3 is a diagram illustrating an example of a radio frequency switching circuit according to a third embodiment of the present disclosure. FIG. 4 is a diagram illustrating an example of a radio frequency switching circuit according to a fourth embodiment of the present disclosure.

Referring to FIGS. 3 and 4, the radio frequency switching circuit according to the third and fourth embodiments may include a reception switching circuit unit 110, a transmission switching circuit unit 120, the first impedance adjuster 310, and the second impedance adjuster 320.

The reception switching circuit unit 110 and the transmission switching circuit unit 120 may perform the same operation according to an embodiment of the present disclosure, and a repeated description thereof will be omitted.

First, referring to FIG. 3, when the reception switching circuit unit 110 is in an off-state, the first impedance adjuster 310 may form an AC ground path between a ground and a gate of each of the first and second transistors M1 and M2 among the first to nth transistors M1 to Mn of the reception switching circuit unit 110.

In this case, the first impedance adjuster 310 may include first and second impedance circuit units 310-1 and 310-2 that are connected between gates and grounds of the respective first and second transistors M1 and M2 among the first through nth transistors M1 to Mn of the reception switching circuit unit 110.

Each of the first and second impedance circuit units 310-1 and 310-2 may include the first switching device SW31 and the first capacitor C31 that connected in series between the ground and the gate of each of the first and second transistors M1 and M2 of the reception switching circuit unit 110.

In this case, the first switching device SW31 may perform switching complementarily to the reception switching circuit unit 110 and may alternately ground the gate of the corresponding transistor of the reception switching circuit unit 110 through the first capacitor C31.

In addition, when the transmission switching circuit unit 120 is in an off-state, the second impedance adjuster 320 may form an AC ground path between the ground and the gate of each of the first and second transistors M1 and M2 among the first to mth transistors M1 to Mm of the transmission switching circuit unit 120.

In this case, the second impedance adjuster 320 may include first and second impedance circuit units 320-1 and 320-2 connected between gates and grounds of the respective first and second transistors M1 and M2 among the first to mth transistors M1 to Mm of the transmission switching circuit unit 120.

Each of the first and second impedance circuit units 320-1 and 320-2 may include the second switching device SW32 and the second capacitor C32 that are connected in series between the ground and the gate of each of the first and second transistors M1 and M2 of the transmission switching circuit unit 120.

In this case, the second switching device SW32 may perform switching complementarily to the transmission switching circuit unit 120 and may alternately ground the gate of the corresponding transistor of the transmission switching circuit unit 120 through the second capacitor C32.

In addition, the first gate signal SG1 may be supplied to the first transistor M1 of the reception switching circuit unit 110 through resistors RA1 and R1 and may be supplied to the second transistor M2 of the reception switching circuit unit 110 through resistors RA2 and R2. In addition, the second gate signal SG2 may be supplied to the first transistor M1 of the transmission switching circuit unit 120 through the resistors RA1 and R1 and may be supplied the second transistor M2 of the transmission switching circuit unit 120 through the resistors RA2 and R2.

Next, referring to FIG. 4, when the reception switching circuit unit 110 is in off-state, the first impedance adjuster 310 may form an AC ground path between a ground and a gate of each of the first through nth transistors M1 to Mn of the reception switching circuit unit 110.

In this case, the first impedance adjuster 310 may include first to $n^{th}$ impedance circuit units 310-1 to 310-$n$ connected between grounds and gates of the respective first through nth transistors M1 to Mn of the reception switching circuit unit 110.

Each of the first to $n^{th}$ impedance circuit units 310-1 to 310-$n$ may include the first switching device SW31 and the first capacitor C31 that are connected in series between the ground and the gate of each of the first through nth transistors M1 to Mn of the reception switching circuit unit 110.

In this case, the first switching device SW31 may perform switching complementarily to the reception switching circuit unit 110 and may alternately ground the gate of the corresponding transistor of the reception switching circuit unit 110 through the first capacitor C31.

When the transmission switching circuit unit 120 is in an off-state, the second impedance adjuster 320 may form an AC ground path between the ground and the gate of the first to $m^{th}$ transistors M1 to Mm of the transmission switching circuit unit 120.

In this case, the second impedance adjuster 320 may include first to nth impedance circuit units 320-1 to 320-$n$ that are connected between grounds and gates of the respective first to $m^{th}$ transistors M1 to Mm of the transmission switching circuit unit 120.

Each of the first to nth impedance circuit units 320-1 to 320-$n$ may include the second switching device SW32 and the second capacitor C32 that connected in series between the ground and the gate of each of the first to $n^{th}$ transistors M1 to Mn of the transmission switching circuit unit 120.

In this case, the second switching device SW32 may perform switching complementarily to the transmission switching circuit unit 120 and may alternately ground the gate of the corresponding transistor of the transmission switching circuit unit 120 through the second capacitor C32.

The first capacitor C31 of the first impedance adjuster 310 may be set to have higher capacitance than parasitic capacitance between a gate and a source of the first transistor M1 of the first switching circuit unit 110.

In this case, when the first switching circuit unit 110 is in an off-state, the first switching device SW31 of the first impedance adjuster 310 may be switched on and bypass a signal supplied to the gate of the first transistor M1 of the first switching circuit unit 110 to the ground through the first capacitor C31 of the first impedance adjuster 310.

The second capacitor C32 of the second impedance adjuster 320 may be set to have higher capacitance than parasitic capacitance between a gate and a source of the first transistor M1 of the second switching circuit unit 120.

In this case, when the second switching circuit unit 120 in an off-state, the second switching device SW32 of the second impedance adjuster 320 may be switched on and bypass a signal supplied to the gate of the first transistor M1 of the second switching circuit unit 120 to the ground through the second capacitor C32 of the second impedance adjuster 320.

Each of the first impedance adjuster 310 and the second impedance adjuster 320 may include at least one impedance circuit unit or include a plurality of impedance circuit units. The same operational principle is applied to the plurality of impedance circuit units.

Accordingly, an operational principle of the first impedance adjuster 310 including one impedance circuit unit will be described below, and a repeated description of the operational principle will be omitted.

Figure 5:
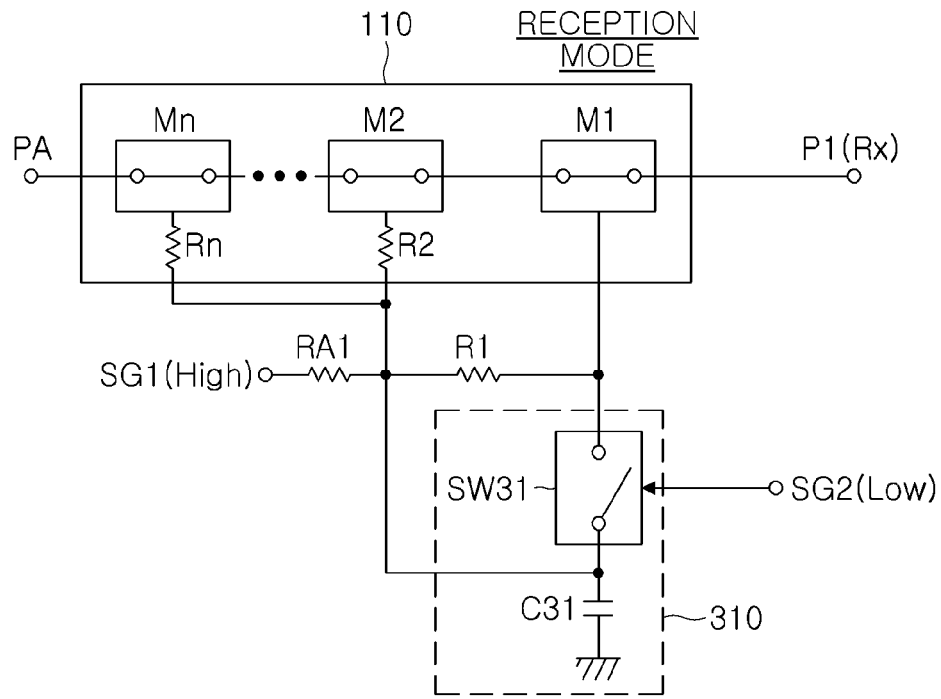
FIG. 5 is a diagram for explaining an operation of a reception mode according to an embodiment of the present disclosure.
Figure 6:
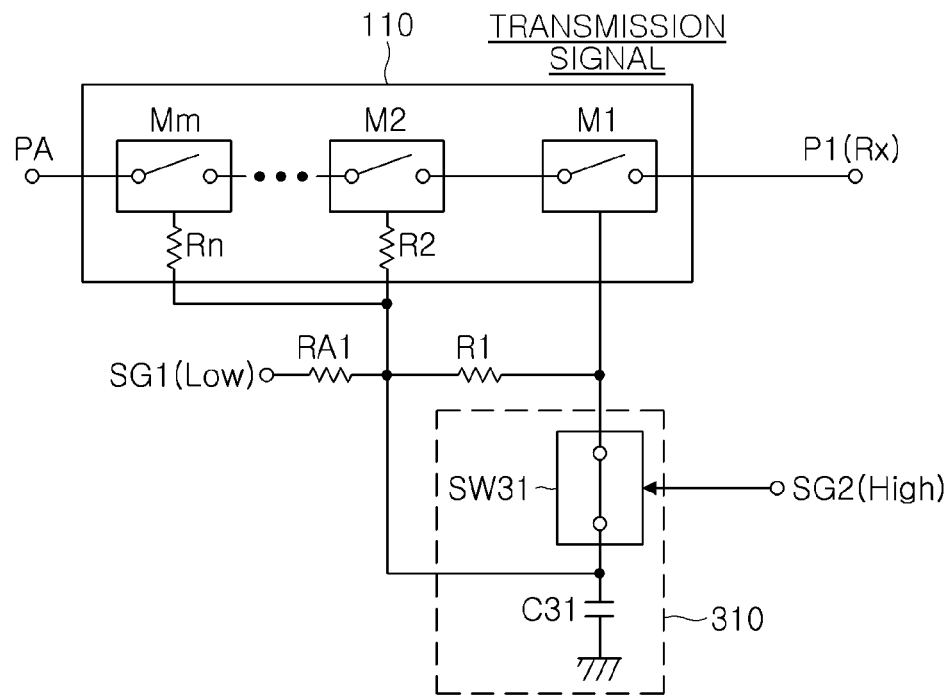
FIG. 6 is a diagram for explaining a transmission mode according to an embodiment of the present disclosure.

FIG. 5 is a diagram for explaining a reception mode according to an embodiment of the present disclosure. FIG. 6 is a diagram for explaining a transmission mode according to an embodiment of the present disclosure.

First, referring to FIG. 5, when the radio frequency switching circuit according to an embodiment of the present disclosure is in a reception mode, the first gate signal SG1 may be in a high level and the second gate signal SG2 may be in a low level in a reception mode.

In this case, the first gate signal SG1 in a high level may be supplied to the first through nth transistors M1 to Mn of the reception switching circuit unit 110 through the resistors RA1 and R1 to Rn such that each of the first through nth transistors M1 to Mn of the reception switching circuit unit 110 may be in an on-state, and the second gate signal SG2 in a low level may be supplied to the first switching device SW31 of the first impedance adjuster 310 such that the first switching device SW31 of the first impedance adjuster 310 may be in an off-state.

In this case, a reception signal through the antenna port PA may be supplied to a receiver (not shown) through the first transistor M1 and the first signal port P1 of the reception switching circuit unit 110.

Next, referring to FIG. 6, when the radio frequency switching circuit according to an embodiment of the present disclosure is in a transmission mode, the first gate signal SG1 may be in a low level and the second gate signal SG2 may be in a high level in a transmission mode.

In this case, the first gate signal SG1 in a low level may be supplied to the first through nth transistors M1 to Mn of the reception switching circuit unit 110 through the resistors RA1 and R1 to Rn such that each of the first through nth transistors M1 to Mn of the reception switching circuit unit 110 may be in an off-state, and the second gate signal SG2 in a high level may be supplied to the first switching device SW31 of the first impedance adjuster 310 such that the first switching device SW31 of the first impedance adjuster 310 may be in an on-state.

As described above, a case in which each of the first through nth transistors M1 to Mn of the reception switching circuit unit 110 is in an off-state will be described with reference to FIGS. 7 and 8.

Figure 7:
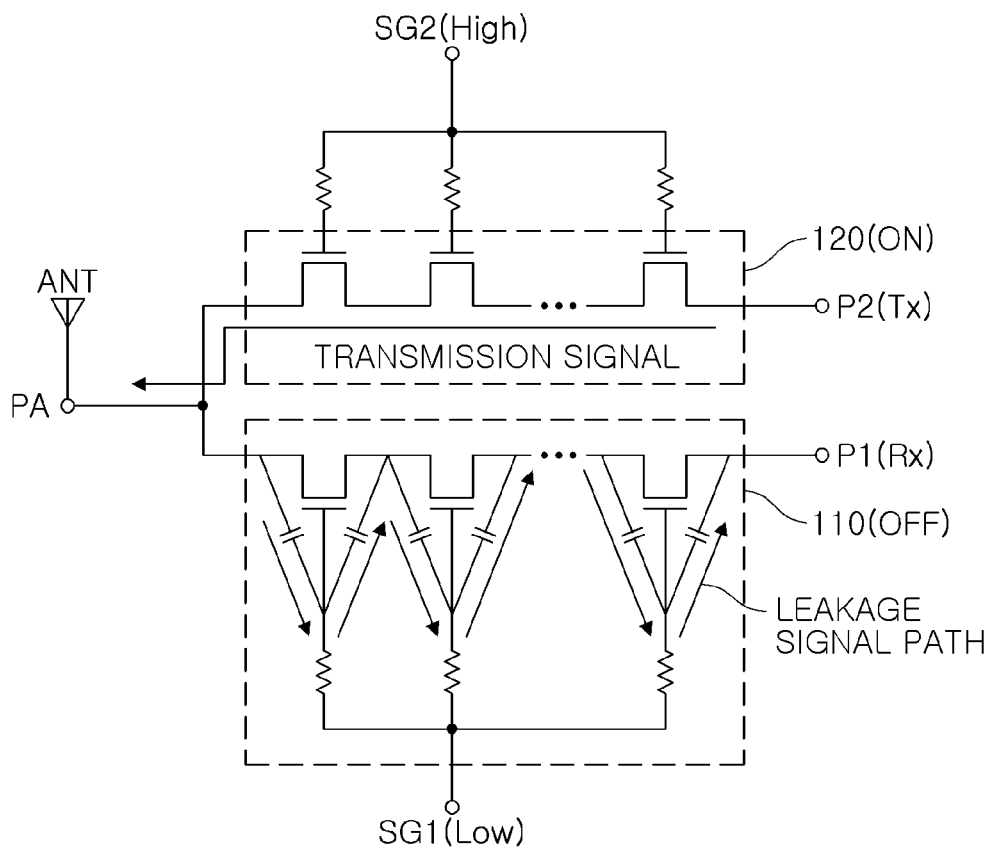
FIG. 7 is a diagram for explaining a leakage signal path of a radio frequency switching circuit according to the related art.

FIG. 7 is a diagram for explaining a leakage signal path of a radio frequency switching circuit according to the related art. FIG. 8 is a diagram for explaining a signal bypass path of a radio frequency switching circuit according to an embodiment of the present disclosure.

Referring to FIG. 7, in the radio frequency switching circuit according to the related art, the transmission switching circuit unit 120 may be in an on-state in a transmission mode to supply a transmission signal to the antenna port PA from the second signal port P2.

In this case, the reception switching circuit unit 110 may be in an off-state. In addition, parasitic capacitances are present between a source and a gate and between the gate and a drain of each of the first through nth transistors M1 to Mn of the reception switching circuit unit 110, and a leakage signal may occur due to the parasitic capacitances. In order to reduce the leakage signal, according to an embodiment of the present disclosure, an impedance adjuster for adjusting gate impedance of the first transistor M1 of the reception switching circuit unit 110 to form a signal path to a ground may be required.

Figure 8:
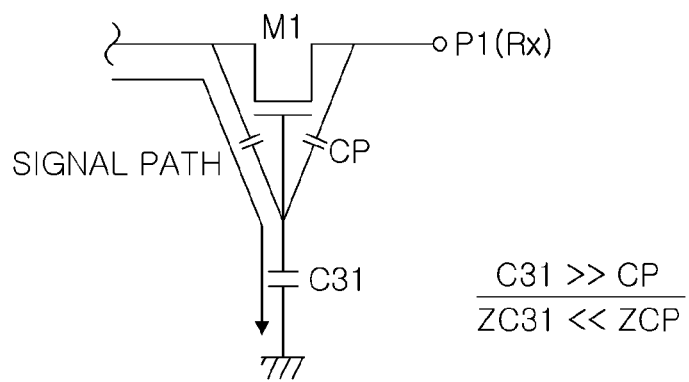
FIG. 8 is a diagram for explaining a signal bypass path of a radio frequency switching circuit according to an embodiment of the present disclosure.

Referring to FIG. 8, in the radio frequency switching circuit according to an embodiment of the present disclosure, the reception switching circuit unit 110 may be in an off-state in a transmission mode, and parasitic capacitances are present between the source and the gate and between the gate and the drain of the first transistor M1 of the reception switching circuit unit 110 as illustrated in FIG. 7.

Simultaneously, since the first switching device SW31 of the first impedance adjuster 310 according to an embodiment of the present disclosure may be in an on-state, the gate of the first transistor M1 is alternately connected to the ground through the first capacitor C31.

In this case, when capacitance of the first capacitor C31 is higher than parasitic capacitance Cp between the gate and the drain of the first transistor M1, reversely, the first capacitor C31 has low impedance and thus, a signal may be by-passed to a ground having relatively low impedance.

Figure 9:
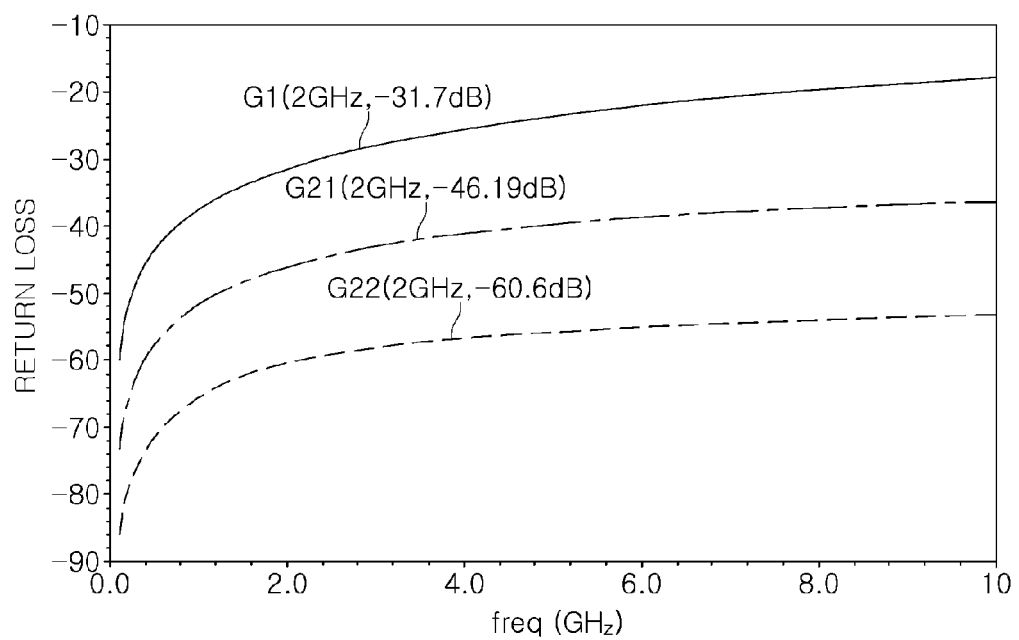
FIG. 9 is a graph illustrating return loss of a radio frequency switching circuit according to an embodiment of the present disclosure.

FIG. 9 is a graph illustrating return loss of a radio frequency switching circuit according to an embodiment of the present disclosure.

In the graph of FIG. 9, a vertical axis denotes return loss, a horizontal axis denotes a frequency, G1 denotes a frequency-return loss plot according to the related art, G2 denotes a frequency-return loss plot when the radio frequency switching circuit according to the present disclosure includes a first impedance adjuster, and G3 denotes a frequency-return loss plot when the radio frequency switching circuit according to the present disclosure includes first and second impedance adjusters.

As seen from G1, G2, and G3 of FIG. 9, when one impedance adjuster, that is, the first impedance adjuster is used (G2), return loss characteristics are enhanced as compared with the related art characteristics G1, and when two impedance adjusters, that is, the first and second impedance adjusters are used (G3), return loss characteristics are further enhanced as compared with the related art characteristics G1.

As set forth above, according to the exemplary embodiments of the present disclosure, gate impedance of a transistor included in a switching circuit unit may be adjusted to improve isolation characteristics of the switching circuit unit and to replace a shunt circuit unit acting as a burden due to a large size thereof.

While exemplary embodiments have been shown and described above, it will be apparent to those skilled in the art that modifications and variations could be made without departing from the spirit and scope of the present disclosure as defined by the appended claims.

What is claimed is:

1. A radio frequency switching circuit comprising:
a first switching circuit unit including first to $n^{th}$ (n is a natural number greater than at least 2) transistors M1 to Mn connected in series between a first signal port for transmission and reception of signals and a common connection node connected to an antenna port and operated according to a first gate signal;
a second switching circuit unit connected in series between the common connection node and a second signal port for transmission and reception of signals and operated according to a second gate signal; and
a first impedance adjuster forming an alternating current (AC) ground path between a ground and a gate of the first transistor of the first switching circuit unit when the first switching circuit unit is in an off-state.

2. The radio frequency switching circuit of claim 1, wherein the first impedance adjuster includes a first switching device and a first capacitor connected in series between the ground and the gate of the first transistor of the first switching circuit unit, and
the first switching device performs a complementary switching operation in conjunction with the first switching circuit unit and alternately grounds the gate of the first transistor of the first switching circuit unit through the first capacitor.

3. The radio frequency switching circuit of claim 2, wherein the first switching device of the first impedance adjuster is in an on-state to bypass a signal supplied to the gate of the first transistor of the first switching circuit unit to the ground through the first capacitor of the first impedance adjuster when the first switching circuit unit is in an off-state.

4. The radio frequency switching circuit of claim 2, wherein the first capacitor of the first impedance adjuster has higher capacitance than parasitic capacitance between the gate and a source of the first transistor of the first transistor of the first switching circuit unit.

5. A radio frequency switching circuit comprising:
a reception switching circuit unit including first to $n^{th}$ (n is a natural number greater than at least 2) transistors connected in series between a first signal port for transmission and reception of signals and a common connection node connected to an antenna port and operated according to a first gate signal;
a transmission switching circuit unit including first to $m^{th}$ (m is a natural number greater than at least 2) transistors connected in series between a second signal port for transmission and reception of signals and the common connection node and operated according to a second gate signal;
a first impedance adjuster forming an alternating current (AC) ground path between a ground and a gate of the first transistor of the reception switching circuit unit when the reception switching circuit unit is in an off-state; and
a second impedance adjuster forming an AC ground path between a ground and a gate of the first transistor of the transmission switching circuit unit when the transmission switching circuit unit is in an off-state.

6. The radio frequency switching circuit of claim 5, wherein the first impedance adjuster includes a first switching device and a first capacitor connected in series between the ground and the gate of the first transistor of the reception switching circuit unit, and
the first switching device performs a complementary switching operation in conjunction with the reception switching circuit unit and alternately grounds the gate of the first transistor of the reception switching circuit unit through the first capacitor.

7. The radio frequency switching circuit of claim 6, wherein the first switching device of the first impedance adjuster is in an on-state to bypass a signal supplied to the gate of the first transistor of the reception switching circuit unit to the ground through the first capacitor of the first impedance adjuster when the reception switching circuit unit is in an off-state.

8. The radio frequency switching circuit of claim 6, wherein the first capacitor of the first impedance adjuster has higher capacitance than parasitic capacitance between the gate and a source of the first transistor of the reception switching circuit unit.

9. The radio frequency switching circuit of claim 5, wherein the second impedance adjuster includes a second switching device and a second capacitor connected in series between the ground and the gate of the first transistor of the transmission switching circuit unit, and
the second switching device performs a complementary switching operation in conjunction with the transmission switching circuit unit and alternately grounds the gate of the first transistor of the transmission switching circuit unit through the second capacitor.

10. The radio frequency switching circuit of claim 9, wherein the second switching device of the second impedance adjuster is in an on-state to bypass a signal supplied to the gate of the first transistor of the transmission switching circuit unit to the ground through the second capacitor of the second impedance adjuster when the transmission switching circuit unit is in an off-state.

11. The radio frequency switching circuit of claim 9, wherein the second capacitor of the second impedance adjuster has higher capacitance than parasitic capacitance between the gate and a source of the first transistor of the transmission switching circuit unit.

12. A radio frequency switching circuit comprising:
a reception switching circuit unit including first to $n^{th}$ (n is a natural number greater than at least 2) transistors connected in series between a first signal port for transmission and reception of signals and a common connection node connected to an antenna port and operated according to a first gate signal,
a transmission switching circuit unit including first to $m^{th}$ (m is a natural number greater than at least 2) transistors connected in series between a second signal port for transmission and reception of signals and the common connection node and operated according to a second gate signal;
a first impedance adjuster forming an alternating current (AC) ground path between a ground and a gate of each of at least two transistors including the first transistor among the first to $n^{th}$ transistors of the reception switching circuit unit when the reception switching circuit unit is in an off-state, and
a second impedance adjuster forming an AC ground path between a ground and a gate of each of at least two transistors including the first transistor among the first to $m^{th}$ transistors of the transmission switching circuit unit when the transmission switching circuit unit is in an off-state.

13. The radio frequency switching circuit of claim 12, wherein the first impedance adjuster includes first to $n^{th}$ impedance circuit units connected between grounds and gates of the respective first to $n^{th}$ transistors of the reception switching circuit unit,
   each of the first to $n^{th}$ impedance circuit units includes a first switching device and a first capacitor connected in series between the ground and the gate of each of the first to $n^{th}$ transistors of the reception switching circuit unit, and
   the first switching device performs a complementary switching operation in conjunction with the reception switching circuit unit and alternately grounds the gate of a corresponding transistor of the reception switching circuit unit through the first capacitor.

14. The radio frequency switching circuit of claim 13, wherein the first switching device of the first impedance adjuster is in an on-state to bypass a signal supplied to the gate of the corresponding transistor among the first to $n^{th}$ transistors of the reception switching circuit unit through the first capacitor of the first impedance adjuster when the reception switching circuit unit is in an off-state.

15. The radio frequency switching circuit of claim 13, wherein the first capacitor of the first impedance adjuster has higher capacitance than parasitic capacitance between the gate and a source of the corresponding transistor of the first to $n^{th}$ transistors of the reception switching circuit unit.

16. The radio frequency switching circuit of claim 12, wherein the second impedance adjuster includes first to $m^{th}$ impedance circuit units connected between grounds and gates of the respective first to $m^{th}$ transistors of the transmission switching circuit unit,
   each of the first to $m^{th}$ impedance circuit units includes a second switching device and a second capacitor connected in series between the ground and the gate of each of the first to $m^{th}$ transistors of the transmission switching circuit unit, and
   the second switching device performs a complementary switching operation in conjunction with the transmission switching circuit unit and alternately grounds the gate of a corresponding transistor of the transmission switching circuit unit through the second capacitor.

17. The radio frequency switching circuit of claim 16, wherein the second switching device of the second impedance adjuster is in an on-state to bypass a signal supplied to the gate of the corresponding transistor among the first to $m^{th}$ transistors of the transmission switching circuit unit to the ground through the second capacitor of the second impedance adjuster when the transmission switching circuit unit is an off-state.

18. The radio frequency switching circuit of claim 16, wherein the second capacitor of the second impedance adjuster has higher capacitance than parasitic capacitance between the gate and a source of the corresponding transistor of the first to $m^{th}$ transistors of the transmission switching circuit unit.

* * * * *